(12) United States Patent
Kang et al.

(10) Patent No.: US 12,477,723 B2
(45) Date of Patent: Nov. 18, 2025

(54) THREE DIMENSIONAL MEMORY DEVICE AND METHOD OF FABRICATION

(71) Applicant: Applied Materials, Inc., Santa Clara, CA (US)

(72) Inventors: Chang Seok Kang, Santa Clara, CA (US); Fred Fishburn, Apotos, CA (US); Tomohiko Kitajima, San Jose, CA (US); Sung-Kwan Kang, San Jose, CA (US); Sony Varghese, Manchester, MA (US); Gill Yong Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 542 days.

(21) Appl. No.: 17/868,156

(22) Filed: Jul. 19, 2022

(65) Prior Publication Data
US 2023/0101155 A1 Mar. 30, 2023

Related U.S. Application Data

(60) Provisional application No. 63/248,799, filed on Sep. 27, 2021.

(51) Int. Cl.
*H10B 12/00* (2023.01)
(52) U.S. Cl.
CPC ............. *H10B 12/50* (2023.02); *H10B 12/09* (2023.02); *H10B 12/30* (2023.02)
(58) Field of Classification Search
CPC ............ H10D 64/035; H01L 21/76897; H10B 12/05; H10B 12/488; H10B 43/40; H10B 12/48; H10B 12/485; H10B 12/50
See application file for complete search history.

(56) References Cited

U.S. PATENT DOCUMENTS

| 7,749,822 B2 * | 7/2010 | Freeman .............. H10D 84/811 |
| | | 257/350 |
| 2012/0273965 A1 | 11/2012 | Seo |
| 2016/0005748 A1 | 1/2016 | Chen |

(Continued)

FOREIGN PATENT DOCUMENTS

| KR | 10-20090128779 A | 12/2009 |
| KR | 10-20190140774 A | 12/2019 |

(Continued)

OTHER PUBLICATIONS

International Search Report and Written Opinion dated Nov. 17, 2022, for the International Patent Application No. PCT/US22/39036, filed on Aug. 1, 2022, 8 pages.

*Primary Examiner* — Edward Chin
(74) *Attorney, Agent, or Firm* — KDW Firm, PLLC

(57) ABSTRACT

A memory device architecture, and method of fabricating a three dimensional device are provided. The memory device architecture may include a plurality of memory blocks, arranged in an array, wherein a given memory block comprises: a cell region, the cell region comprising a three-dimensional array of memory cells, arranged in a plurality of n memory cell layers; and a staircase region, the staircase region being disposed adjacent to at least a first side of the cell region, the staircase region comprising a signal line assembly that is coupled to the three-dimensional array of memory cells.

11 Claims, 10 Drawing Sheets

(56) References Cited

U.S. PATENT DOCUMENTS

| | | | |
|---|---|---|---|
| 2016/0027778 A1* | 1/2016 | Moriwaki | H10D 64/671 |
| | | | 257/401 |
| 2018/0323199 A1* | 11/2018 | Roberts | H10D 64/518 |
| 2018/0336950 A1 | 11/2018 | Jeong et al. | |
| 2019/0013323 A1* | 1/2019 | Bhattacharyya | H10D 30/694 |
| 2020/0083225 A1 | 3/2020 | Ma | |
| 2020/0212041 A1 | 7/2020 | Machkaoutsan et al. | |
| 2020/0227416 A1 | 7/2020 | Lilak et al. | |
| 2020/0251151 A1 | 8/2020 | Kang | |
| 2021/0013210 A1 | 1/2021 | Lee et al. | |
| 2021/0202488 A1 | 7/2021 | Choi | |
| 2021/0249415 A1 | 8/2021 | Kang | |
| 2022/0293582 A1* | 9/2022 | Moriwaki | H10D 64/514 |
| 2022/0384720 A1* | 12/2022 | Fratin | G11C 13/0069 |
| 2023/0081072 A1* | 3/2023 | Ramkumar | H10B 43/35 |
| | | | 438/258 |

FOREIGN PATENT DOCUMENTS

| | | |
|---|---|---|
| KR | 10-20210085417 A | 7/2021 |
| TW | I720675 B | 3/2021 |

\* cited by examiner

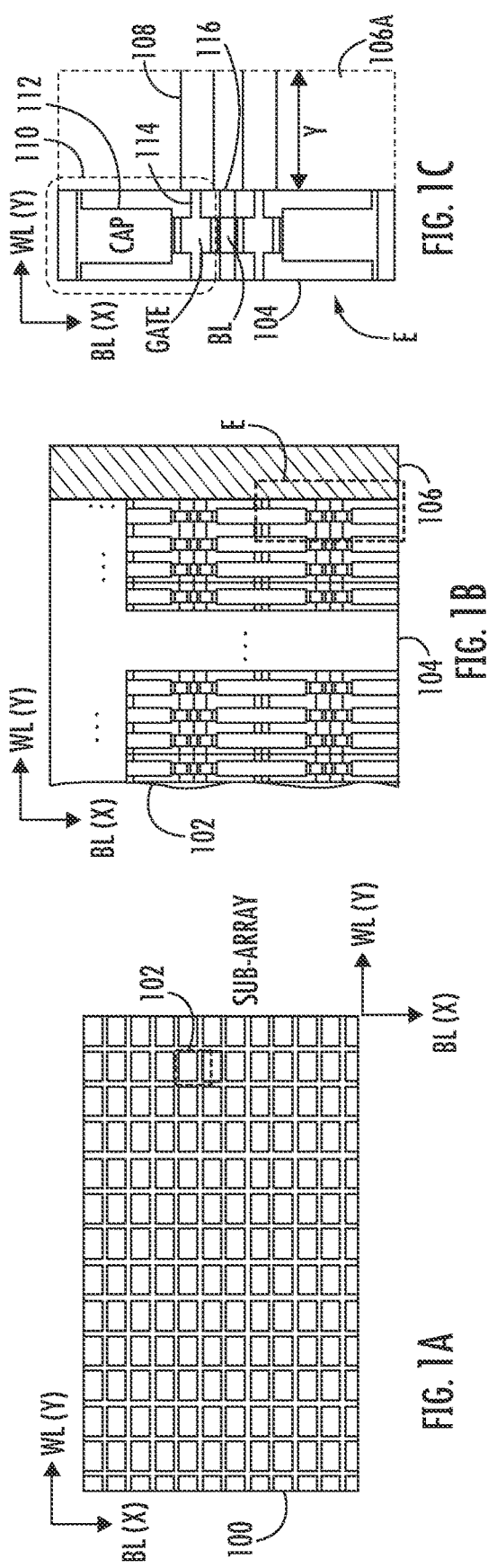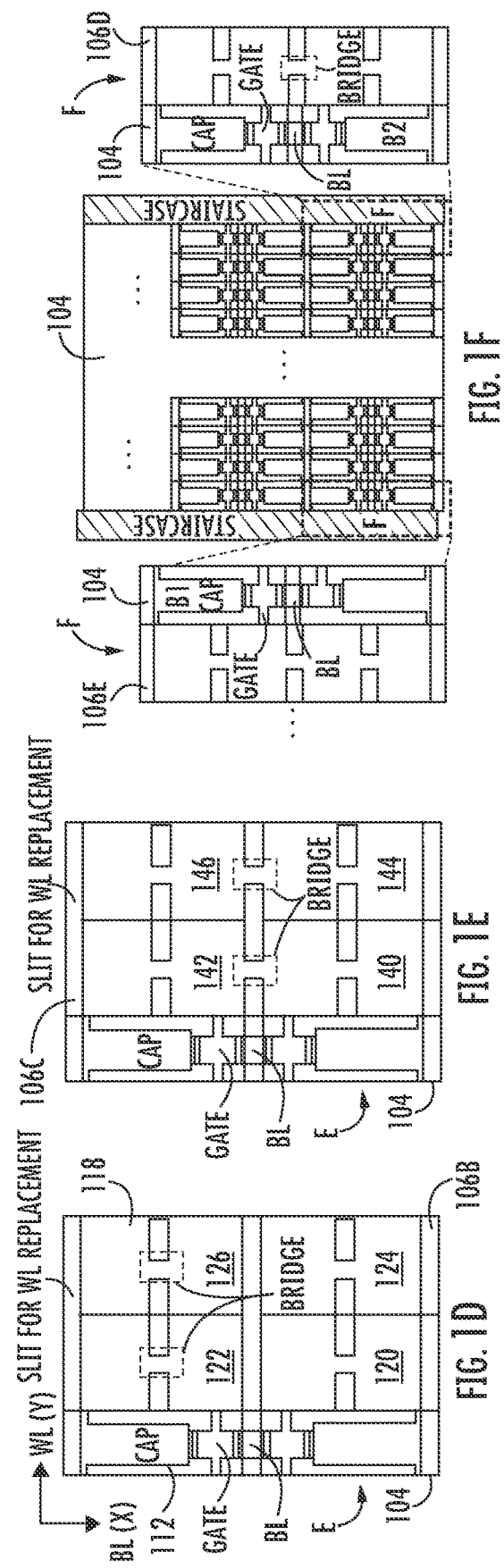

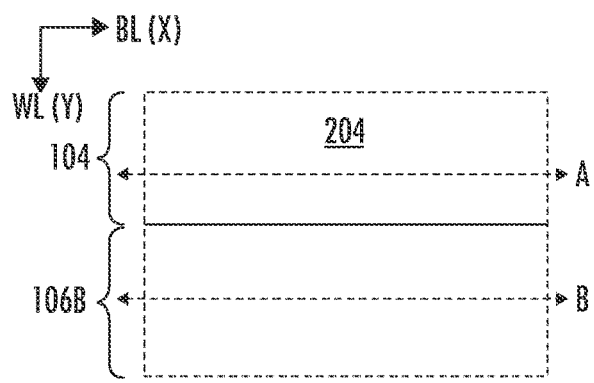
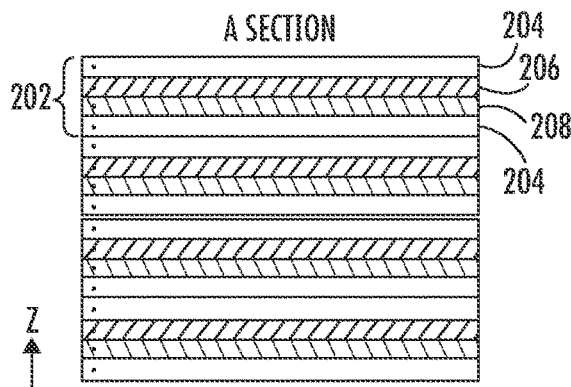
FIG. 2A
FIG. 2B
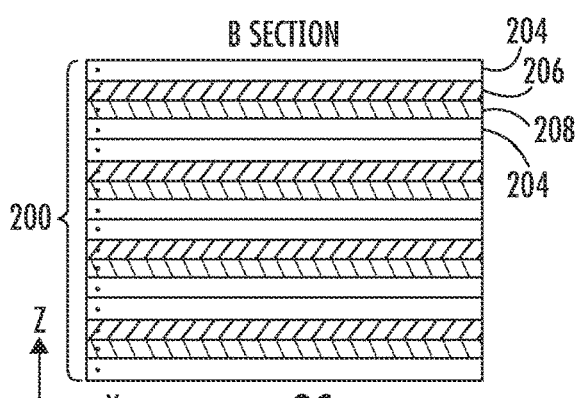
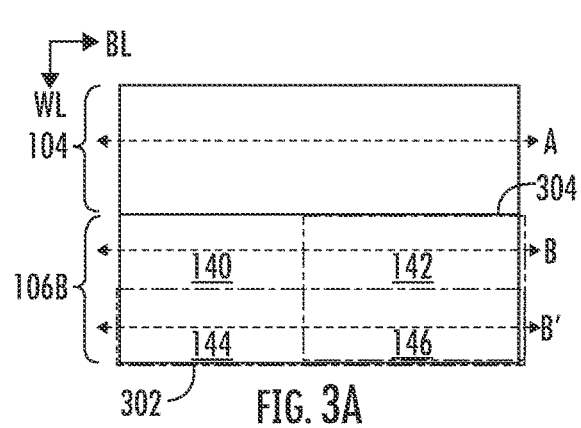
FIG. 2C
FIG. 3A
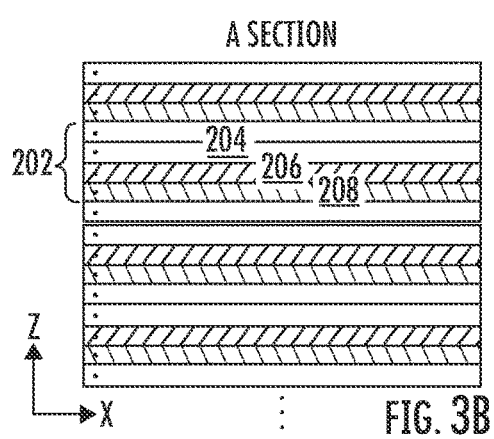
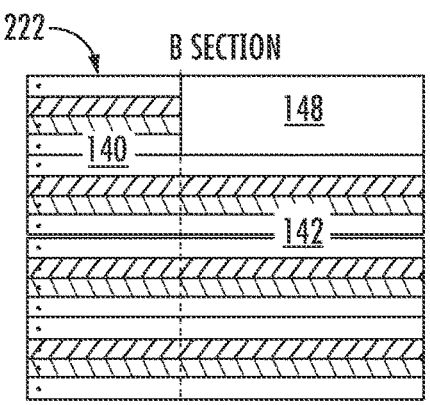
FIG. 3B
FIG. 3C
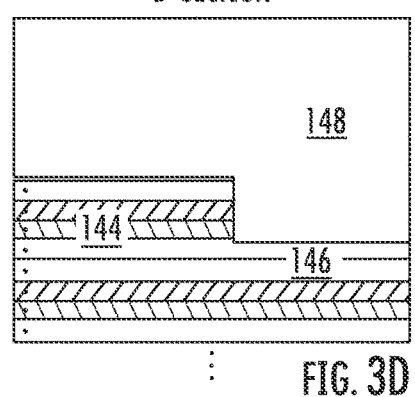
FIG. 3D

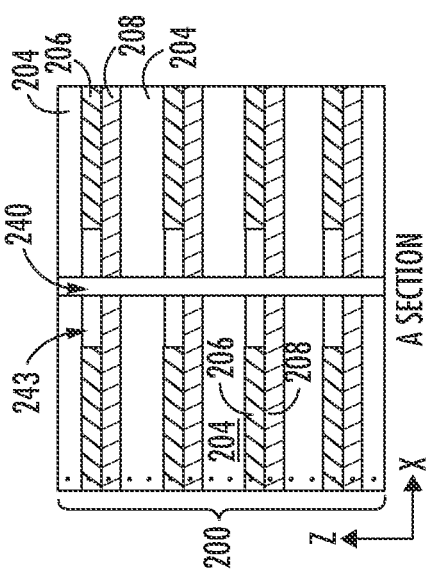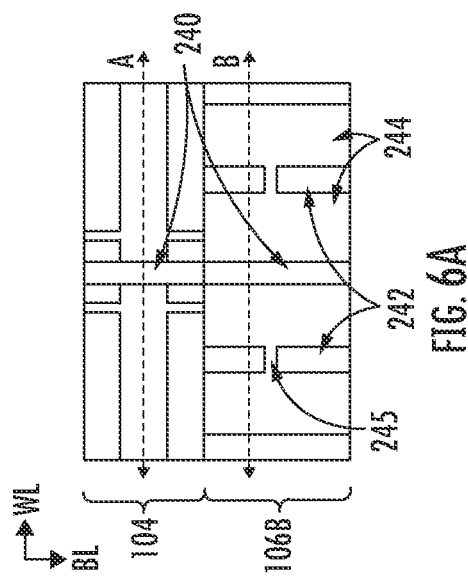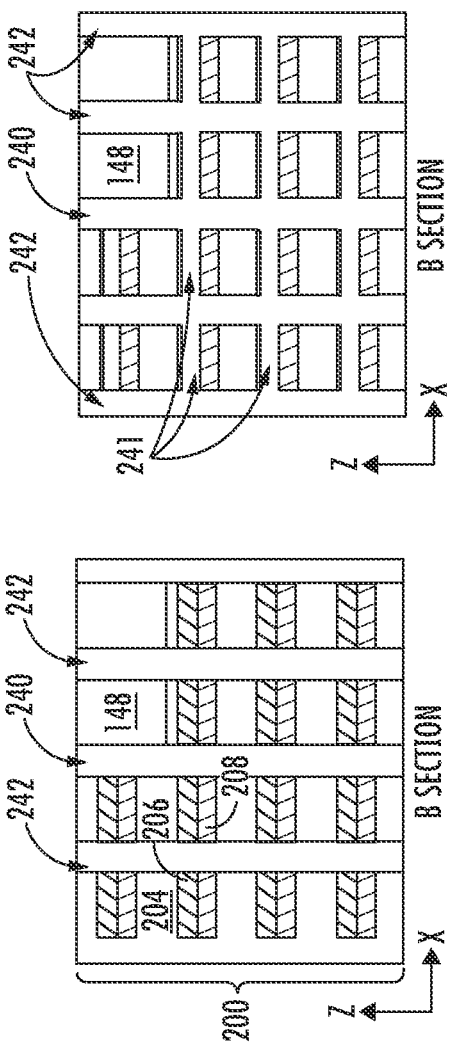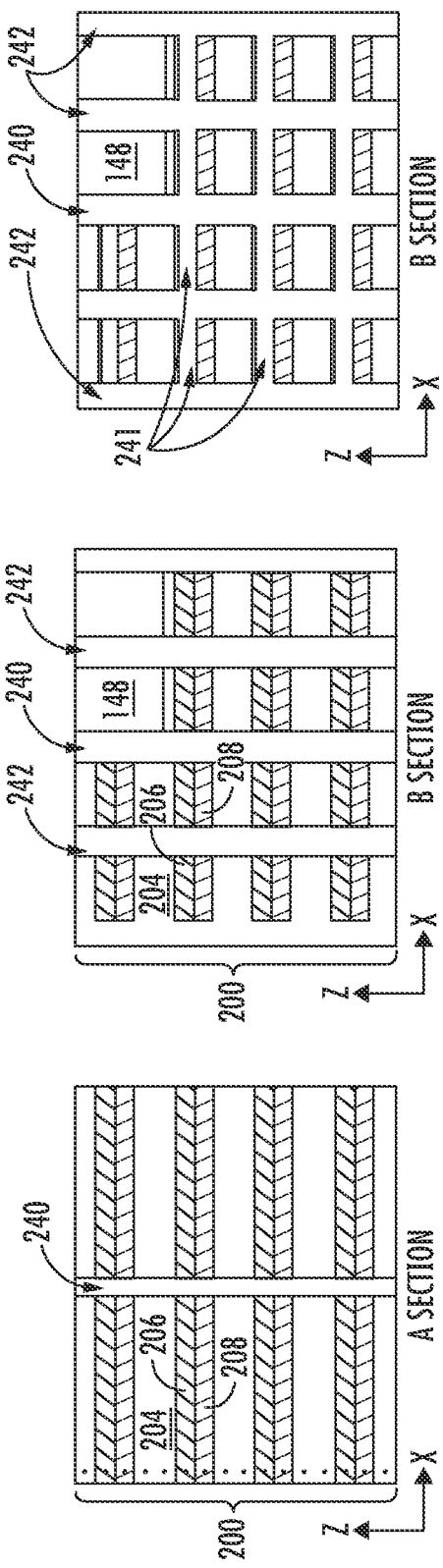

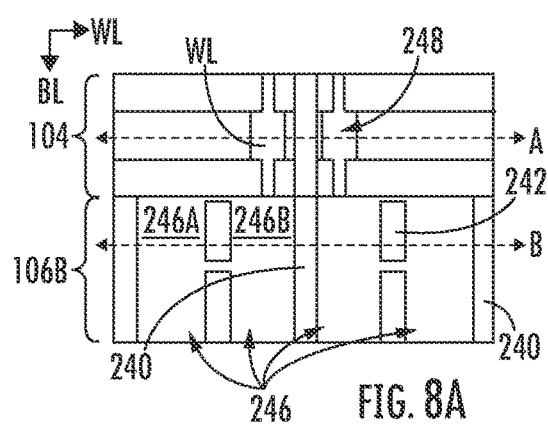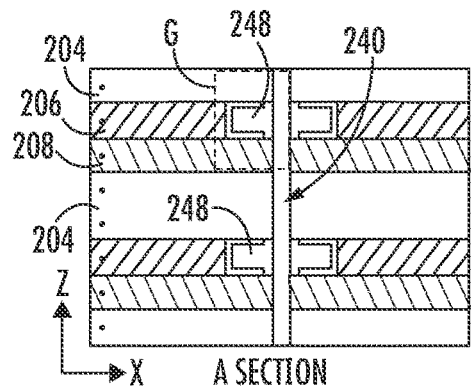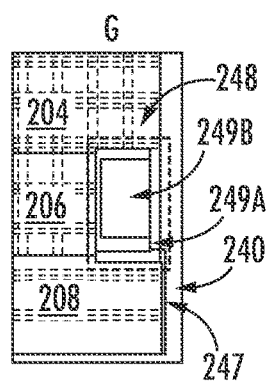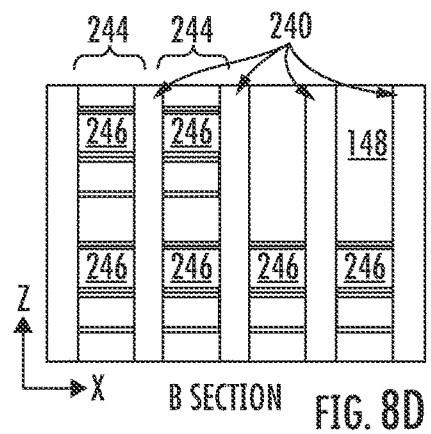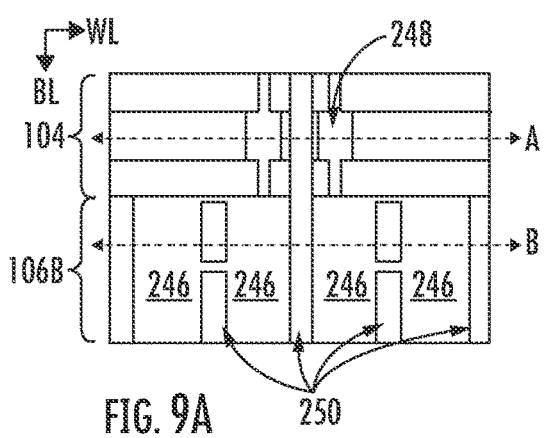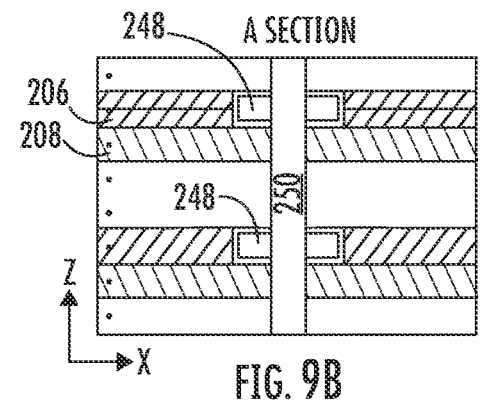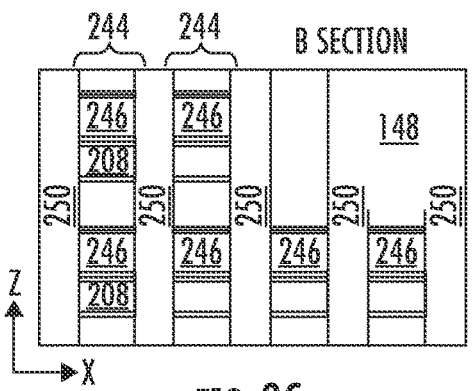

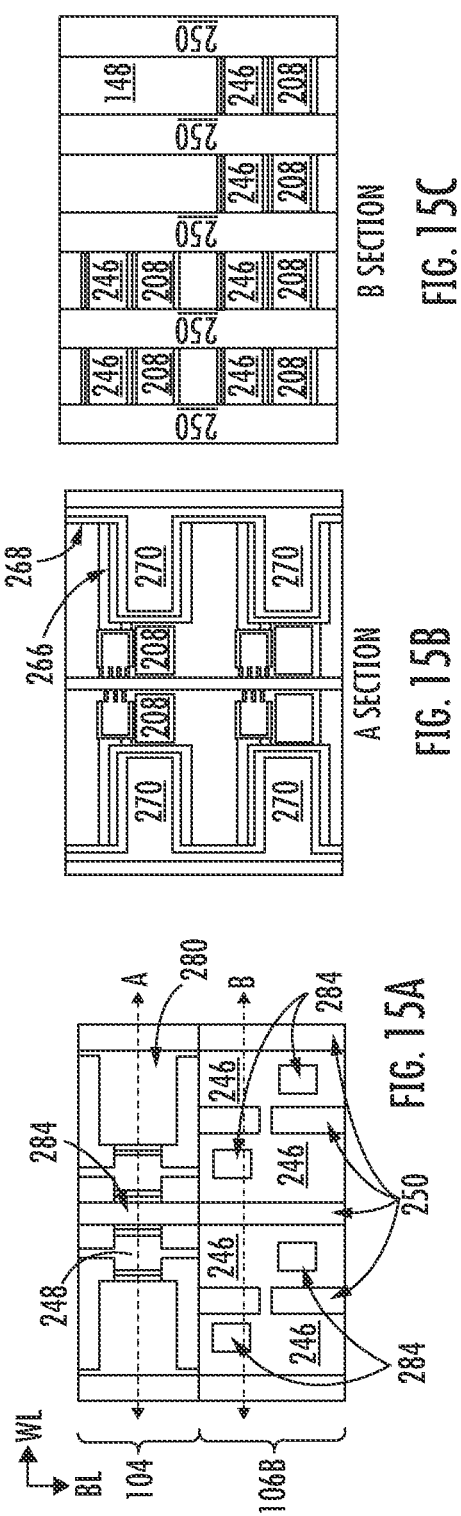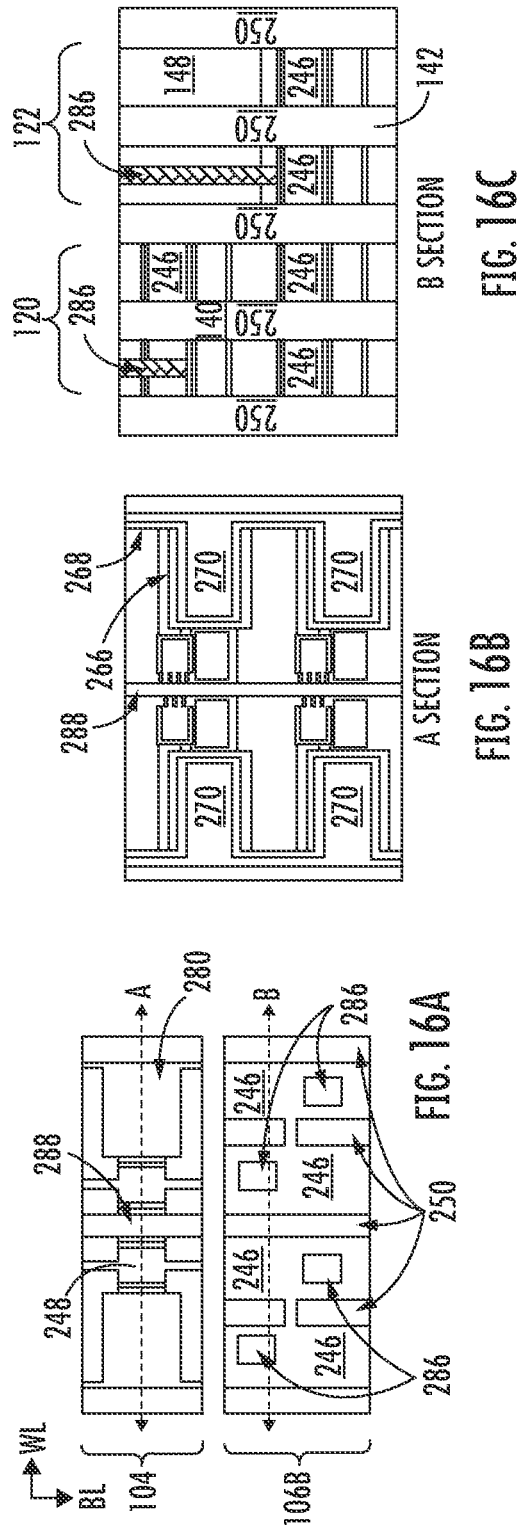

THREE DIMENSIONAL MEMORY DEVICE AND METHOD OF FABRICATION

CROSS-REFERENCE TO RELATED APPLICATION

The present application claims priority to U.S. Provisional patent application Ser. No. 63/248,799, filed Sep. 27, 2021, entitled "THREE DIMENSIONAL MEMORY DEVICE AND METHOD OF FABRICATION", and incorporated by reference herein in its entirety.

FIELD

The present embodiments relate to semiconductor substrates, and more particularly, to three dimensional semiconductor device structures.

BACKGROUND

A trend in the evolution of semiconductor technology based upon integrated circuits is an increase in device density within a semiconductor die, and an increase in device functionality. In the case of memory devices, such as dynamic random access memory (DRAM), one factor that improves memory size for a DRAM chip for a given die area is the shrinking of the cell size for individual memory cells. The shrinking of cell size is associated with multiple well known issues.

One approach that is envisioned to increasing memory size within a given die area is to fabricate three dimensional memory, such as three dimensional (3D) DRAM. In this case, multiple memory cells may be stacked in layers, one upon another in a "vertical" direction, orthogonal to the main plane of the semiconductor die. An issue with respect to formation of such devices is the ability to address all the cells in a memory array. For example, a DRAM memory may be arranged in blocks or sub-arrays, where every wordline for a given stack of layers of a 3D DRAM sub-array is to have a contact to connect the wordline with controlling circuits in the sub-array. As a consequence, for a 3D DRAM memory stack having n-layers, a total of n wordline contacts are needed in each row of wordlines. As such, the region to arrange such a wordline contact architecture, such as in a peripheral region adjacent to a sub-array, may consume a large fraction of the (two-dimensional, in-plane) device area for a given memory sub-array. Moreover, the size of this peripheral wordline area will increase with the number of layers, n, within a 3D DRAM memory array or sub-array. Thus, the peripheral wordline area will tend to consume a greater fraction of total DRAM area in a 3D DRAM as the number of layers increases.

With respect to these and other considerations, the present disclosure is provided.

BRIEF SUMMARY

In one embodiment, a memory device architecture is provided. The memory device architecture may include a plurality of memory blocks, arranged in an array. A given memory block may include a cell region, the cell region comprising a three-dimensional array of memory cells, arranged in a plurality of n memory cell layers, and a staircase region, the staircase region being disposed adjacent to at least a first side of the cell region, the staircase region comprising a signal line assembly that is coupled to the three-dimensional array of memory cells.

In another embodiment, a method of fabricating a three-dimensional device may include providing, on a substrate, a memory stack, comprising a plurality of n unit stacks, wherein a given unit stack comprises an isolation layer, a sacrificial layer, and an active layer. The method may include also patterning the memory stack to form a plurality of memory blocks, arranged in an array. As such, a given memory block may include a cell region, the cell region comprising a three-dimensional array of memory cells, arranged in a plurality of n memory cell layers, and a staircase region, disposed adjacent to at least a first side of the cell region, the staircase region comprising a signal line assembly that is coupled to the three-dimensional array of memory cells.

In a further embodiment, a three-dimensional dynamic random access memory may include a plurality of memory blocks, arranged in an array. A given memory block may include a cell region, the cell region comprising a three-dimensional array of memory cells, arranged in a plurality of n memory cell layers. The cell region may further comprise a first plurality of bitlines, extending along a first direction, and a second plurality of wordlines, arranged within the plurality of n memory cell layers, and extending along a second direction, different from the first direction. The given memory block may also include a staircase region, the staircase region being disposed adjacent to at least a first side of the cell region, the staircase region comprising a wordline assembly that is connected to the second plurality of wordlines of the three-dimensional array of memory cells.

BRIEF DESCRIPTION OF THE DRAWINGS

FIG. 1A depicts a top plan view of a memory array, consistent with embodiments of the disclosure;

FIG. 1B depicts a top plan view of a portion of a memory block, in accordance with embodiments of the disclosure;

FIG. 1C depicts an enlarged top plan view of a region of the memory block portion of FIG. 1B, according to an embodiment of the disclosure;

FIG. 1D depicts an enlarged top plan view of a region of the memory block portion of FIG. 1B, according to another embodiment of the disclosure;

FIG. 1E depicts an enlarged top plan view of a region of the memory block portion of FIG. 1B, according to another embodiment of the disclosure;

FIG. 1F depicts a memory block as well as two enlarged top plan views of respective regions along opposite sides of the memory block in accordance with an additional embodiment of the disclosure;

FIG. 2A depicts a top plan view of a memory block during a stage of fabrication, according to an embodiment of the disclosure;

FIG. 2B depicts a cross-sectional view of the memory block of FIG. 2A along the A section;

FIG. 2C depicts a cross-sectional view of the memory block of FIG. 2A along the B section;

FIG. 3A depicts a top plan view of the memory block of FIG. 2A during a subsequent stage of fabrication;

FIG. 3B depicts a cross-sectional view of the memory block of FIG. 3A along the A section;

FIG. 3C depicts a cross-sectional view of the memory block of FIG. 3A along the B section;

FIG. 3D depicts a cross-sectional view of the memory block of FIG. 3A along the B' section;

FIG. 6A depicts a top plan view of the memory block of FIG. 5A during a subsequent stage of fabrication;

FIG. 6B depicts a cross-sectional view of the memory block of FIG. 6A along the A section;

FIG. 6C depicts a cross-sectional view of the memory block of FIG. 6A along the B section;

FIG. 7A depicts a cross-sectional view of the memory block of FIG. 6B along the A section at a subsequent stage of fabrication;

FIG. 7B depicts a cross-sectional view of the memory block of FIG. 7A along the B section;

FIG. 8A depicts a top plan view of the memory block of FIG. 7A during a subsequent stage of fabrication;

FIG. 8B depicts a cross-sectional view of the memory block of FIG. 8A along the A section;

FIG. 8C depicts an enlarged portion of the view of FIG. 8B along the A section;

FIG. 8D depicts a cross-sectional view of the memory block of FIG. 8A along the B section;

FIG. 9A depicts a top plan view of the memory block of FIG. 8A during a subsequent stage of fabrication;

FIG. 9B depicts a cross-sectional view of the memory block of FIG. 9A along the A section;

FIG. 9C depicts a cross-sectional view of the memory block of FIG. 9A along the B section;

FIG. 15A depicts a top plan view of the memory block of FIG. 13A during a subsequent stage of fabrication;

FIG. 15B depicts a cross-sectional view of the memory block of FIG. 15A along the A section;

FIG. 15C depicts a cross-sectional view of the memory block of FIG. 15A along the B section;

FIG. 16A depicts a top plan view of the memory block of FIG. 15A during a subsequent stage of fabrication;

FIG. 16B depicts a cross-sectional view of the memory block of FIG. 16A along the A section; and FIG. 16C depicts a cross-sectional view of the memory block of FIG. 16A along the B section.

DETAILED DESCRIPTION

Figure 1G:
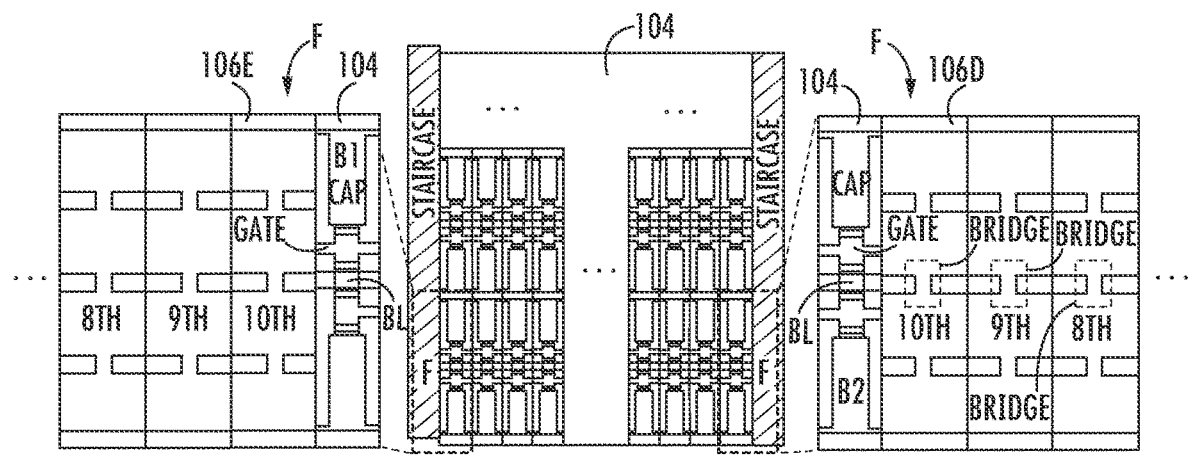
FIG. 1G and FIG. 1H show two variants, respectively, of the staircase structure shown in FIG. 1F, according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel architecture for devices that are formed from three dimensional (3D) arrays of unit structures, such as in memory devices, or other semiconductor devices. These techniques may especially be applicable to formation of DRAM devices, while other devices may also be formed according to the embodiments of the disclosure. Various non-limiting embodiments are particularly useful for implementation where the arrays are arranged as multiple blocks or sub-arrays that are connected to controlling circuitry.

In various embodiments of the disclosure, a novel staircase architecture is coupled to a block of three dimensional array of memory cells of a device. The novel staircase architecture may further include a novel signal line arrangement, as detailed below. For the purposes of illustration, a wordline assembly for a three-dimensional memory array will be disclosed in detail, as representative of a signal line arrangement according to some embodiments. This wordline assembly may include an array of wordlines, arranged to contact memory cells in multiple layers of the three dimensional array of memory cells, as well as a wordline contact assembly, to couple to control circuitry. However, the present embodiments may extend to other signal lines for other three-dimensional device types, including non-volatile memory based upon charge-trap storage media or phase change material, or storage media based upon resistivity change.

Turning now to FIG. 1A there is shown a top plan view of a memory array 100, consistent with embodiments of the disclosure. The memory array 100 may represent a DRAM array, for example, where the memory array 100 is formed of a three dimensional array of memory cells, or bits, as follows. As shown in FIG. 1A, a two-dimensional array of sub-arrays is visible, arranged in the X-Y plane of the Cartesian coordinate system shown. For the purposes of illustration, where the memory array 100 may represent a DRAM array, the memory array 100 is arranged in a rectangular grid of sub-arrays, referred to as memory blocks 102. As further illustrated at FIG. 1B, in accordance with embodiments of the disclosure, a given memory block 102 may include a cell region 104 and a staircase region 106, disposed adjacent to a side of the cell region 104. In particular, the cell region 104 may be arranged as a three-dimensional array of memory bits, or memory cells, distributed through n-layers. According to various embodiments of the disclosure, the value of "n" may be any suitable number up to 100 layers or more. Likewise, in various embodiments of the disclosure, the staircase region 106 may be arranged as a series of n stairs. The staircase region 106 may provide access for control circuitry to contact the cell region using wordline contacts that are arranged within the staircase region 106, as detailed further below.

For the purposes of illustration, in a cell region 104, 1000 memory cells may be arranged per wordline along the Y-direction. Thus, the view of FIG. 1B shows just an edge portion of the cell region 104, adjacent the staircase region 106. FIG. 1C depicts an enlarged top plan view of a region of the memory block portion of FIG. 1B, according to an embodiment of the disclosure. A memory cell 110, along the edge of cell region 104, is shown, including capacitor 112, gate 114, and bitline 116. A wordline region structure 108 extends in the staircase region 106. For a 250 nm cell width and 1024 memory cells, the cell region 104 may have a width of 256 mm, while the staircase region 106A of FIG. 1C has a width of 75 mm, for a 100 layer thick 3D memory. Thus, the staircase region 106A uses approximately 29% of the area of the memory block 102. Note that in this embodiment, the stair width along the X-direction may be equivalent to the width of the wordline along the X-direction. Note that in this embodiment, as well as embodiments to follow a wordline may extend along a first direction, while a bitline extends along a second direction, such as perpendicular to the first direction.

In other embodiments, the staircase region 106 may be arranged differently, so as to improve the efficiency of the layout of the wordline connection to the cell region 104. FIG. 1D depicts an enlarged top plan view of a region of the memory block portion of FIG. 1B, according to another embodiment of the disclosure. FIG. 1E depicts an enlarged top plan view of a region of the memory block portion of FIG. 1B, according to another embodiment of the disclosure. The embodiment of FIG. 1E may represent a variant of the embodiment of FIG. 1D. Turning in particular to FIG. 1D, in this embodiment, a staircase region 106B is arranged along a side of the cell region 104. For purposes of clarity of explanation, the staircase region 106B is shown to include four stairs, a stair 120, stair 122, stair 124, and stair 126. However, in other embodiments, a staircase region may include many more stairs. A wordline structure 118 is formed within the staircase region 106B, where formation of such a wordline structure is detailed below. As visible in the plan view of FIG. 1D, the wordline structure 118 occupies a majority of the area of the staircase region 106B. In the example of FIG. 1D the stair width, as well as the wordline structure width along the X-direction is equivalent to the width of the capacitor 112 plus the wordline width (of the wordline structure of FIG. 1C). Said differently, the wordline structure width is equivalent to approximately the bit width of a given memory cell along the X-direction. The same applies for the embodiment of FIG. 1E, also having a staircase region 106C, including four stairs, a stair 140, stair 142, stair 144, and stair 146. A difference in the two embodiments is that in the embodiment of FIG. 1E, at least one replacement slot and bridge (which portion may act as a connecting portion) is provided for one wordline.

FIG. 1F depicts a memory block as well as two enlarged top plan views of respective regions along opposite sides of the memory block in accordance with an additional embodiment of the disclosure. In particular, the cell region 104 is flanked on opposite sides by a staircase region 106D and staircase region 106E, respectively. Note that in the staircase region 106E, the top bit B1 is connected to the corresponding wordline structure of the staircase region 106E, while in the staircase region 106D, the bottom bit B2 is connected to the corresponding wordline structure of the staircase region 106D. In this example, the staircase width (as well as wordline structure width) along the X-direction may extend equivalent to 2 times the sum of wordline width plus capacitor width, or 2*(WL width+Cap width), or two times the memory cell width.

Figure 1H:
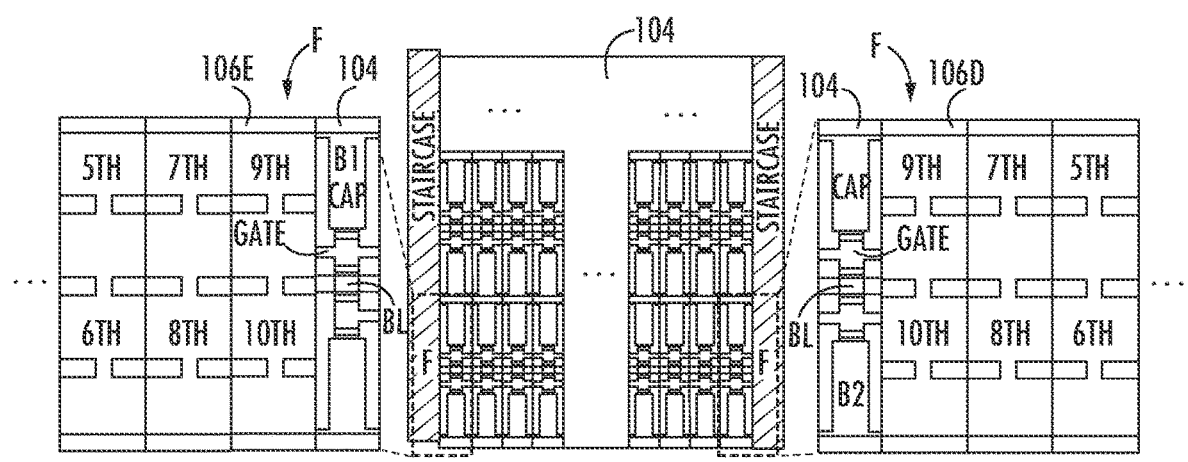

Turning to FIG. 1G and FIG. 1H, there are shown two variants of the staircase structure shown in FIG. 1F. As shown in FIG. 1G, a set of 2i'th WLs (in WL direction) are connected with the right side of the cell region 104, and a set of 2i+1 th WLs are connected with the left side of the cell region 104. Each set of WLs (2i+1, or 2i in WL direction) have n WLs stacked in z-direction. On the right/left side of array, each set of WLs (2i+1, or 2i in WL direction) has staircases with heights ranging from $1^{st}$ unit cell to the n'th unit cell. In particular, FIG. 1G presents an embodiment where one height exists with one unit staircase width, while in the embodiment of FIG. 1H two heights exist in one unit staircase width. Therefore, the embodiment of FIG. 1H has a smaller staircase area than the embodiment of FIG. 1G.

In FIGS. 2A-16C to follow, there are shown various views of the embodiment of the memory cell architecture of FIG. 1C, at different stages of fabrication. This fabrication sequence may apply in particular to 3D DRAM, while in other embodiments of the disclosure, the general staircase fabrication principles as illustrated herein below may be applied to any other device structures, where signal lines are to be connected to stacked conductive layers of a 3D device.

FIG. 2A depicts a top plan view of a memory block corresponding to the embodiment of FIG. 1D, during a stage of fabrication, according to an embodiment of the disclosure. In this example, the view is rotated 90 degrees with respect to the view of FIG. 1D. FIG. 2B depicts a cross-sectional view of the memory block of FIG. 2A along the A section, while FIG. 2C depicts a cross-sectional view of the memory block of FIG. 2A along the B section. As shown in FIG. 2A, a portion of the cell region 104 abuts against the staircase region 106B. As further depicted in FIG. 2B and FIG. 2C, a series of unit stacks 202 that constitute different layers of the 3D memory block are shown. A given unit stack, in turn, is formed of multiple layers, including an active layer. In some embodiments, a unit stack 202 is formed of an isolation layer 204, such as SiO, a sacrificial layer 206, such as SiN, and active layer 208, such as polysilicon. These layers may be deposited in blanket form, at least over the region of the memory device forming the memory block. According to some embodiments, the thickness range for the isolation layer 204, sacrificial layer 206, and active layer 208 may be in the range of 5 nm-50 nm for any of these layers. In this embodiment, a total of four of the unit stacks 202 are deposited to form the layer stack 200, corresponding to four different memory layers of the 3D memory device. As shown in FIG. 2A and FIG. 2B, at this stage, both the cell region 104 and the staircase region 106B are unpatterned.

FIG. 3A depicts a top plan view of the memory block of FIG. 2A during a subsequent stage of fabrication, where patterning of the staircase region 106B has taken place. FIG. 3B depicts a cross-sectional view of the memory block of FIG. 3A along the A section, showing that the cell region 104 remains unpatterned.

FIG. 3C depicts a cross-sectional view of the memory block of FIG. 3A along the B section, which section intersects the stair 140 and stair 142 of the staircase region 106B. FIG. 3D depicts a cross-sectional view of the memory block of FIG. 3A along the B' section, which section intersects the stair 144 and stair 146 of the staircase region 106B. As shown, patterning has taken place to form the individual stairs. The patterning may be performed using known techniques to selectively open targeted regions of the staircase region 106B. In one example, a first patterning operation etches a region, 302, while a second patterning operation etches region 304, as shown. After etching of the individual stairs, dielectric 148 is deposited to fill the etched regions, such as SiO. The dielectric 148 may then be planarized using a known operation, such as chemical mechanical polishing.

As shown in FIG. 3C, the upper surface 222 of stair 140 represents the uppermost layer of the layer stack 200, while the upper surface of stair 142 is recessed by one of the unit stacks 202 from upper surface 222; the upper surface of stair 144 is recessed by two of the unit stacks 202 from upper surface 222; and the upper surface of stair 146 is recessed by three of the unit stacks 202 from upper surface 222.

Figure 4A:
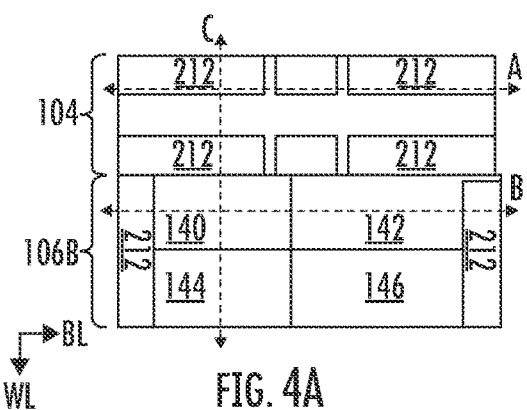
FIG. 4A depicts a top plan view of the memory block of FIG. 3A during a subsequent stage of fabrication.
Figure 4B:
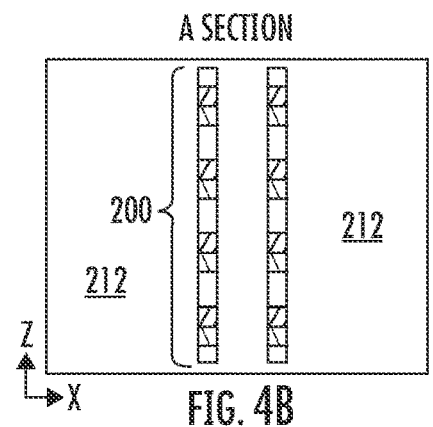
FIG. 4B depicts a cross-sectional view of the memory block of FIG. 4A along the A section.
Figure 4C:
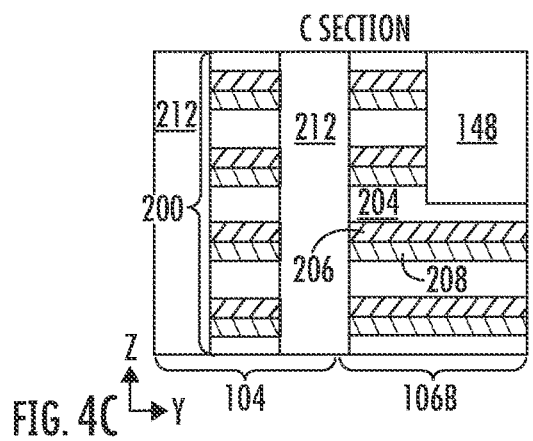
FIG. 4C depicts a cross-sectional view of the memory block of FIG. 4A along the C section.
Figure 4D:
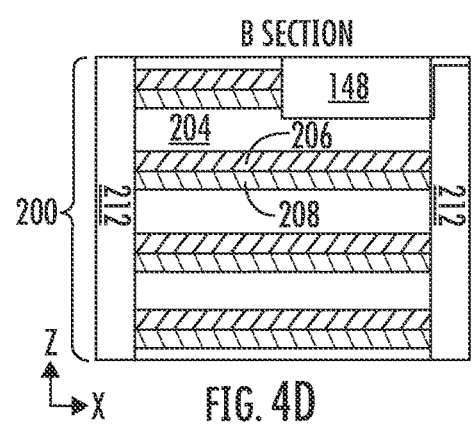
FIG. 4D depicts a cross-sectional view of the memory block of FIG. 4A along the B' section.

FIG. 4A depicts a top plan view of the memory block of FIG. 3A during a subsequent stage of fabrication. FIG. 4B depicts a cross-sectional view of the memory block of FIG. 4A along the A section, while FIG. 4C depicts a cross-sectional view of the memory block of FIG. 4A along the C section. FIG. 4D depicts a cross-sectional view of the memory block of FIG. 4A along the B section. As shown in FIG. 4A-FIG. 4B, isolation regions 212 have been formed in the cell region 104 and in the staircase region 106B by etching through the entirety of the layer stack 200.

Figure 5A:
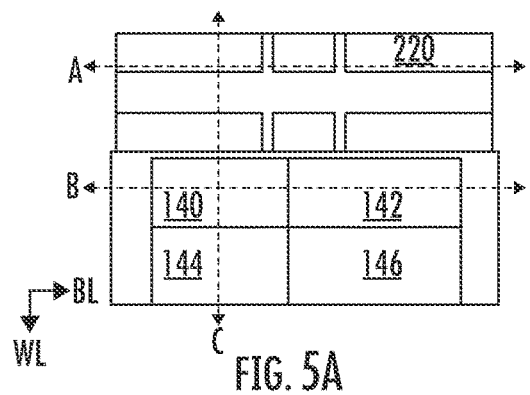
FIG. 5A depicts a top plan view of the memory block of FIG. 4A during a subsequent stage of fabrication.
Figure 5B:
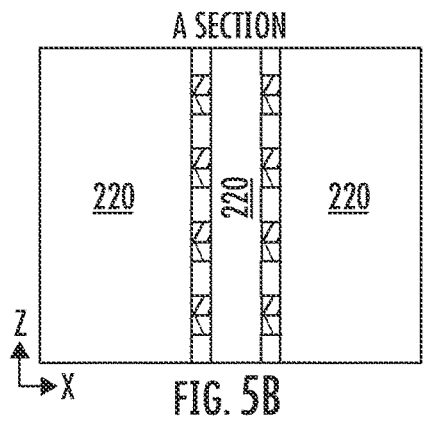
FIG. 5B depicts a cross-sectional view of the memory block of FIG. 5A along the A section.
Figure 5C:
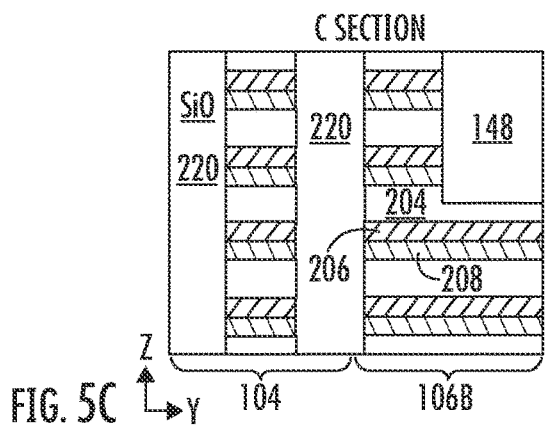
FIG. 5C depicts a cross-sectional view of the memory block of FIG. 5A along the C section.
Figure 5D:
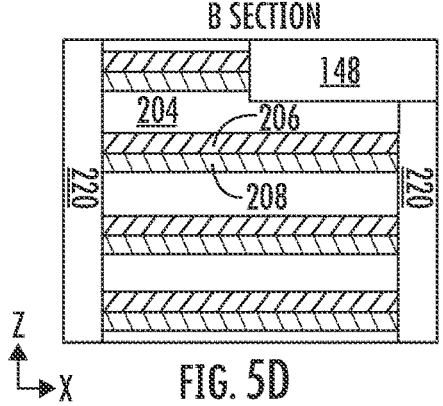
FIG. 5D depicts a cross-sectional view of the memory block of FIG. 5A along the B section.

FIG. 5A depicts a top plan view of the memory block of FIG. 4A during a subsequent stage of fabrication. FIG. 5B depicts a cross-sectional view of the memory block of FIG. 5A along the A section, while FIG. 5C depicts a cross-sectional view of the memory block of FIG. 5A along the C section, and FIG. 5D depicts a cross-sectional view of the memory block of FIG. 5A along the B section. At this stage, filler insulation (e.g., SiO) has been formed in the isolation regions 212, creating filled isolation regions 220. Subsequently, planarization may be performed to yield the structure as shown in FIGS. 5B-5D.

FIG. 6A depicts a top plan view of the memory block of FIG. 5A during a subsequent stage of fabrication, while FIG. 6B depicts a cross-sectional view of the memory block of FIG. 6A along the A section, and FIG. 6C depicts a cross-sectional view of the memory block of FIG. 6A along the B section. At this stage, patterning has taken place to form replacement gate structures in transistors to be formed in the memory cells of the cell region 104. The patterning involves etching the entirety of the layer stack 200, to form a continuous slit 240, extending within cell region 104 and into the staircase region 106B, as shown in particular in FIG. 6A. As shown also in FIG. 6A, discontinuous slits 242 are formed within the staircase region 106B, where a bridge portion 245 isolates different portions of the discontinuous slits 242. In turn, the discontinuous slits 242 isolate main portions 244 of the staircase region 106B from one another.

FIG. 7A depicts a cross-sectional view of the memory block of FIG. 6B along the A section at a subsequent stage of fabrication, while FIG. 7B depicts a cross-sectional view of the memory block of FIG. 7A along the B section. At this stage of processing a portion of the sacrificial layer 206, adjacent the continuous slit 240, has been selectively etched to form a recess 243. Likewise, the sacrificial layer 206 may be etched within the staircase region 106, forming recesses 241. The selective etching may be performed, for example, by providing a selective etchant through the continuous slit 240, and along discontinuous slits 242. Hot phosphorous acid may be a suitable example of a selective etchant for the case where sacrificial layer 206 is silicon nitride (SiN), active layer 208 is silicon, and isolation layer 204 is silicon oxide (SiO).

FIG. 8A depicts a top plan view of the memory block of FIG. 7A during a subsequent stage of fabrication, while FIG. 8B depicts a cross-sectional view of the memory block of FIG. 8A along the A section, and FIG. 8C depicts an enlarged portion of the view of FIG. 8B along the A section. In addition, FIG. 8D depicts a cross-sectional view of the memory block of FIG. 8A along the B section. At this stage of fabrication, transistor formation has taken place by forming a gate oxide layer 247 over an exposed portion of the active layer 208, adjacent the continuous slit 240. In various non-limiting embodiments, the gate oxide may be a suitable insulator, such as a 2 nm-thick to 10 nm-thick silicon oxide layer.

In addition, a wordline assembly has been formed, where the wordline assembly is depicted as wordline portion 248, disposed in the cell region 104, and a wordline structure 246, disposed in the staircase region 106B. As shown in FIG. 8D, the wordline structure 246 forms in recesses 241, previously formed in the main portions 244 of the staircase region 106B. In the view of FIG. 8A, the wordline structure 246 may correspond to more than one wordline. Thus, as a result of the structure of the main portions 244, on a given stair, the wordline structure may have more than one main portion, such as a first main portion 246A and a second main portion 246B, as shown. According to some non-limiting embodiments, the wordline structure may be formed using a metallurgy, such as a TiN liner layer 249A, and a tungsten portion 249B. To form the wordline portion 248, such metallurgy may be deposited in the recess 243 be providing depositing species via the continuous slit 240, using any suitable process, including atomic layer deposition (ALD). Node separation may then be carried out by removing TiN and W from the continuous slit 240, as depicted in FIG. 8B and FIG. 8C, showing that the continuous slit 240 is again empty. Likewise, this metallurgy may also deposit in the recesses 241 of staircase region 106B via the continuous slit 240, and discontinuous slits 242.

FIG. 9A depicts a top plan view of the memory block of FIG. 8A during a subsequent stage of fabrication, while FIG. 9B depicts a cross-sectional view of the memory block of FIG. 9A along the A section, and FIG. 9C depicts a cross-sectional view of the memory block of FIG. 9A along the B section. At this stage of processing, the continuous slit 240 and the discontinuous slits 242 have been filled by an insulator, forming isolation structures 250. The isolation structures 250 be formed by a suitable deposition process, such as atomic layer deposition of silicon oxide, according to some non-limiting embodiments. Subsequently, planarization may be performed, resulting in the structure as shown in FIG. 9B and FIG. 9C, in particular.

Figure 10A:
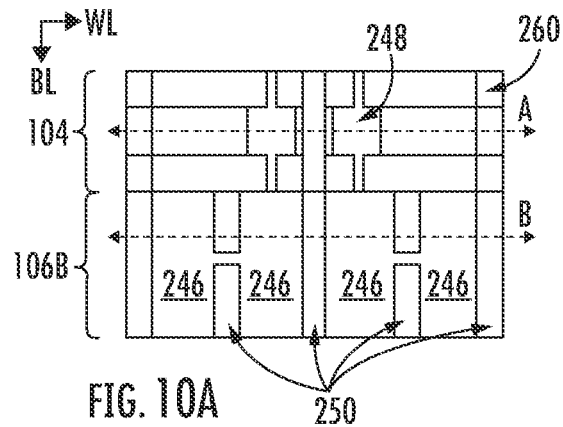
FIG. 10A depicts a top plan view of the memory block of FIG. 9A during a subsequent stage of fabrication.
Figure 10B:
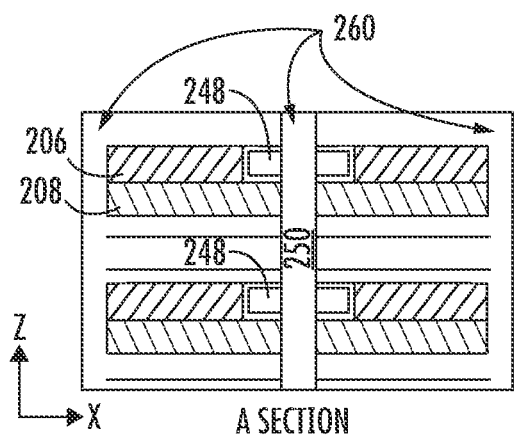
FIG. 10B depicts a cross-sectional view of the memory block of FIG. 10A along the A section.
Figure 10C:
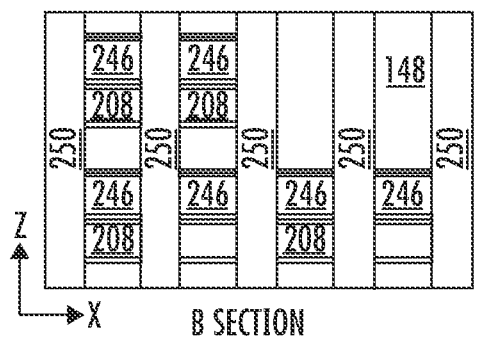
FIG. 10C depicts a cross-sectional view of the memory block of FIG. 10A along the B section.

FIG. 10A depicts a top plan view of the memory block of FIG. 9A during a subsequent stage of fabrication, while FIG. 10B depicts a cross-sectional view of the memory block of FIG. 10A along the A section, and FIG. 10C depicts a cross-sectional view of the memory block of FIG. 10A along the B section. At this stage, the structure of staircase region 106B, as depicted in FIG. 10C, has not changed from the structure of FIG. 9C. In the cell region 104, capacitor slits 260 have been formed by etching through the entirety of the layer stack 200.

Figure 11A:
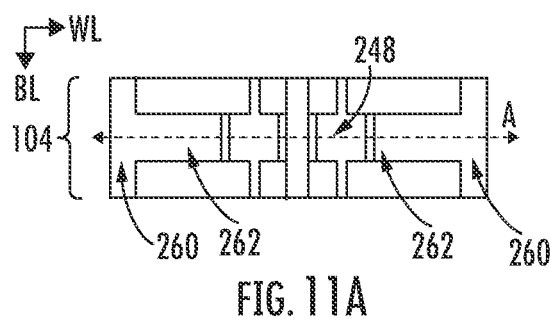
FIG. 11A depicts a top plan view of the memory block of FIG. 10A during a subsequent stage of fabrication.
Figure 11B:
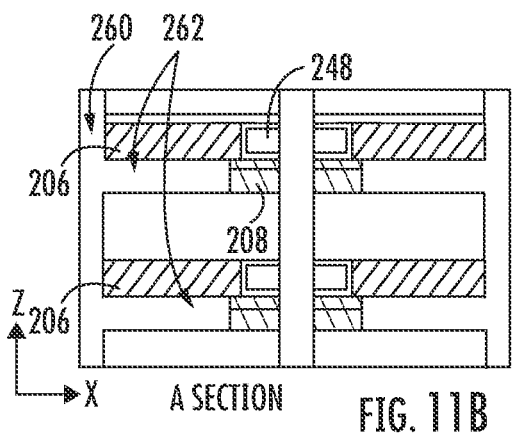
FIG. 11B depicts a cross-sectional view of the memory block of FIG. 11A along the A section.

FIG. 11A depicts a top plan view of the memory block of FIG. 10A during a subsequent stage of fabrication, FIG. 11B depicts a cross-sectional view of the memory block of FIG. 11A along the A section. At this stage, the structure of staircase region 106B (not shown) has not changed from the structure of FIG. 10C. In the cell region 104, capacitor recesses 262 have been formed by etching a portion of the active layer 208, as shown in FIG. 11B in particular. This etching may be performed in a selective manner that selectively removes polysilicon with respect to silicon nitride and silicon oxide, for example, in the case where active layer 208 is silicon or polysilicon.

Figure 12A:
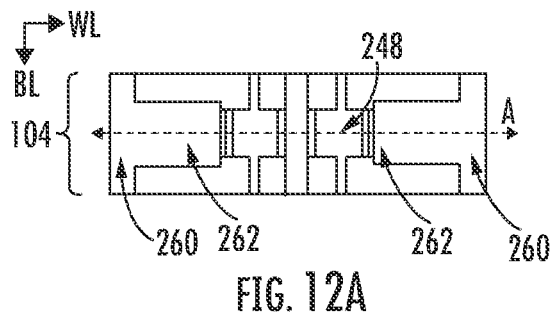
FIG. 12A depicts a top plan view of the memory block of FIG. 11A during a subsequent stage of fabrication.
Figure 12B:
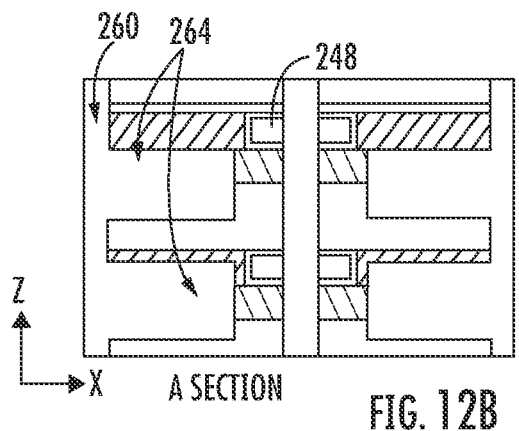
FIG. 12B depicts a cross-sectional view of the memory block of FIG. 12A along the A section.

FIG. 12A depicts a top plan view of the memory block of FIG. 11A during a subsequent stage of fabrication, while FIG. 12B depicts a cross-sectional view of the memory block of FIG. 12A along the A section. At this stage, the structure of staircase region 106B (not shown) has not changed from the structure of FIG. 10C. In the cell region 104, widened capacitor recesses 264 have been formed by etching a portion of the isolation layer 204, a portion of the sacrificial layer 206, as well as more of the active layer 208, as shown in FIG. 12B in particular. This etching may be performed in one or more etch operations, where a given etch operation may be performed in a selective manner according to some embodiments. For example, one etch operation may be performed in a selective manner that selectively removes polysilicon with respect to silicon nitride and silicon oxide, in the case where active layer 208 is silicon or polysilicon. For example, multiple selective etch operations may be performed in sequence in a given process chamber or bath, or performed in different chambers.

Figure 13A:
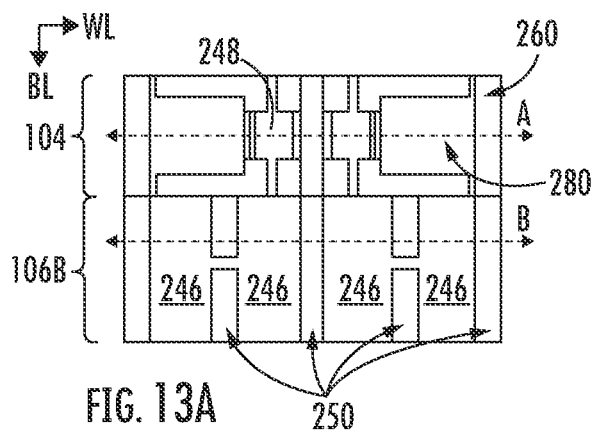
FIG. 13A depicts a top plan view of the memory block of FIG. 12A during a subsequent stage of fabrication.
Figure 13B:
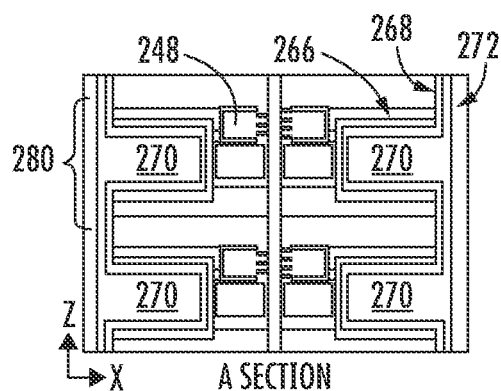
FIG. 13B depicts a cross-sectional view of the memory block of FIG. 13A along the A section.
Figure 13C:
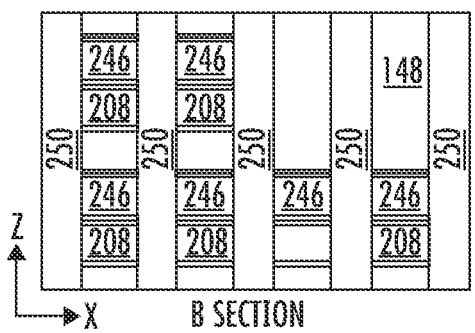
FIG. 13C depicts a cross-sectional view of the memory block of FIG. 13A along the B section.

FIG. 13A depicts a top plan view of the memory block of FIG. 12A during a subsequent stage of fabrication, while FIG. 13B depicts a cross-sectional view of the memory block of FIG. 13A along the A section, while FIG. 13C depicts a cross-sectional view of the memory block of FIG. 13A along the B section. At this stage, the structure of staircase region 106B (not shown) has not changed from the structure of FIG. 10C. As shown in FIG. 13A and FIG. 13B, capacitors 280 have been formed in the cell region 104. Details of the formation of capacitors 280 according to some non-limiting embodiments of the disclosure are described below.

Figure 14A:
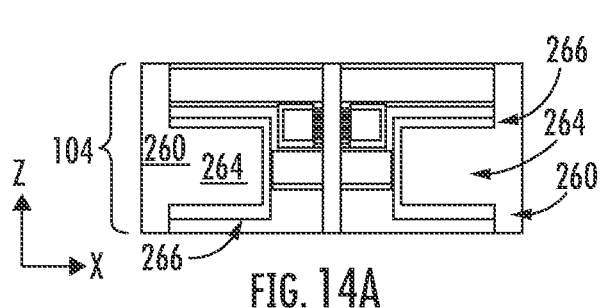
FIG. 14A depicts a partial cross-sectional view of the memory block of FIG. 12B along the A section, at an intermediate stage subsequent to the stage of FIG. 12B and before the stage of FIG. 13B.
Figure 14B:
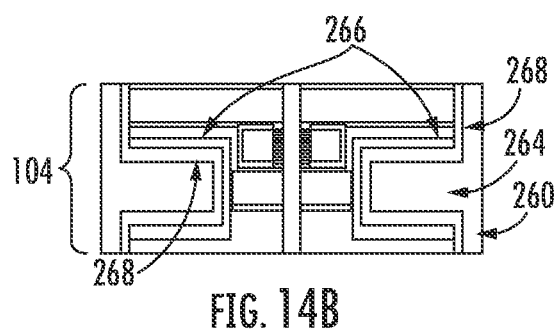
FIG. 14B depicts a partial cross-sectional view of the structure of FIG. 14A along the A section, at an intermediate stage subsequent to the stage of FIG. 14A and before the stage of FIG. 13B.
Figure 14C:
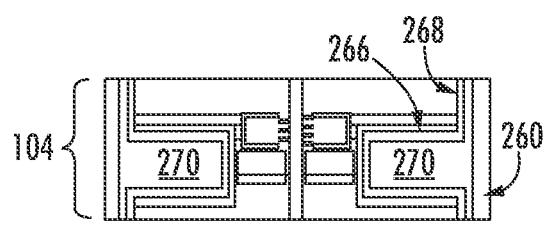
FIG. 14C depicts a partial cross-sectional view of the structure of FIG. 14B along the A section, at an intermediate stage subsequent to the stage of FIG. 14B and before the stage of FIG. 13B.
Figure 14D:
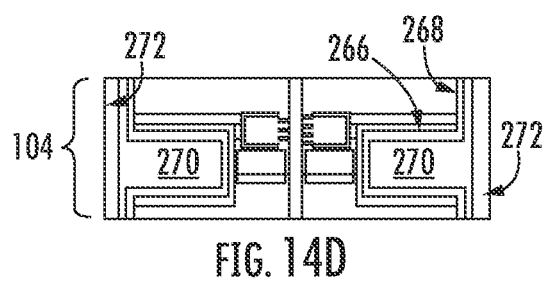
FIG. 14D depicts a partial cross-sectional view of the memory block of FIG. 13B.

In particular, FIG. 14A depicts a partial cross-sectional view of the memory block of FIG. 12B along the A section, at an intermediate stage subsequent to the stage of FIG. 12B and before the stage of FIG. 13B. Likewise, FIG. 14B depicts a partial cross-sectional view of the structure of FIG. 14A along the A section, at an intermediate stage subsequent to the stage of FIG. 14A and before the stage of FIG. 13B. Similarly, FIG. 14C depicts a partial cross-sectional view of the structure of FIG. 14B along the A section, at an intermediate stage subsequent to the stage of FIG. 14B and before the stage of FIG. 13B. FIG. 14D depicts a partial cross-sectional view of the memory block of FIG. 13B.

Turning now to FIG. 14A, there is shown the structure after deposition of a bottom electrode layer 266, such as a TiN layer or other suitable electrode material layer. At FIG. 14B, the structure is depicted after formation of capacitor storage layer 268, which layer may be a suitable high dielectric constant layer. A non-limiting example of a suitable high dielectric constant layer is HfZrO. At FIG. 14C, the structure is shown after formation of a top electrode 270, such as a TiN layer or other suitable electrode material layer. At FIG. 14D, the structure is shown after formation of a second top electrode 272, such as a SiGe material. Note that the materials as shown in FIGS. 14A-14D are merely exemplary, and other suitable capacitor materials as known in the art may be used, according to additional embodiments of the disclosure.

FIG. 15A depicts a top plan view of the memory block of FIG. 13A during a subsequent stage of fabrication, while FIG. 15B depicts a cross-sectional view of the memory block of FIG. 15A along the A section and FIG. 15C depicts a cross-sectional view of the memory block of FIG. 15A along the B section. At this stage of processing, a contact pattern 284 has been defined, over the top surface of the memory block structure in the cell region 104, as well as in the staircase region 106B. The contact pattern 284 defines regions for forming bitline contacts and wordline contacts.

FIG. 16A depicts a top plan view of the memory block of FIG. 15A during a subsequent stage of fabrication, while FIG. 16B depicts a cross-sectional view of the memory block of FIG. 16A along the A section; and FIG. 16C depicts a cross-sectional view of the memory block of FIG. 16A along the B section. At this stage of processing, bitline 288 is shown, including a bitline contact, where a combination of TiN and W may be used for this process. Additionally, a wordline contact assembly that is made of a plurality of wordline contacts 286 has been formed in the staircase region 106B. The cross-section of FIG. 16C illustrates two wordline contacts, one wordline contact in stair 140, and another wordline contact in stair 142.

While the process flow highlighted in the aforementioned figures illustrates a four-stair staircase embodiment, embodiments of a three dimensional device having many more memory cell layers may include staircase embodiments having the same number of stairs as the number of memory cell layers, meaning unit stacks. For staircase embodiments having dozens of stairs, up to more than one hundred stairs, a corresponding wordline contact assembly may include a wordline contact on an uppermost wordline structure of each given stair.

Figure 17:
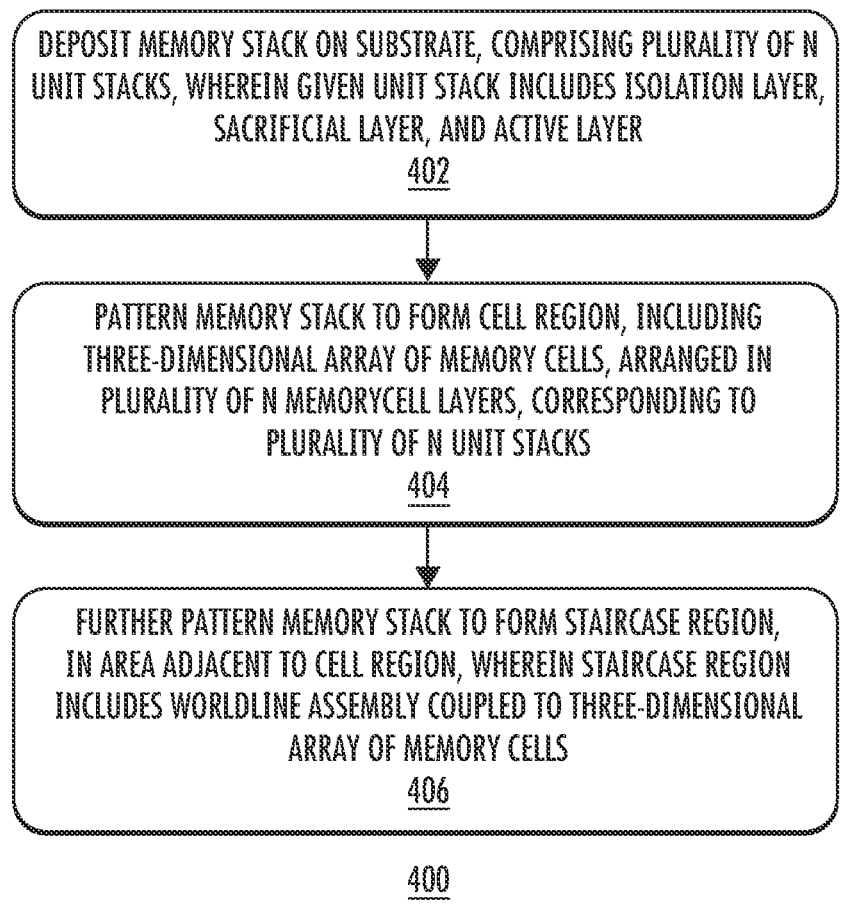
FIG. 17 presents an exemplary process flow according to an embodiment of the disclosure.

FIG. 17 depicts an exemplary process flow 400, according to embodiments of the disclosure. At block 402, a memory stack is deposited on a substrate, such as a silicon substrate or other semiconductor substrate. The memory block may include a plurality of n unit stacks, wherein a given unit stack includes an isolation layer, sacrificial layer, and an active layer. The value of n may range from a few layers to more than one hundred layers according to various non-limiting embodiments. In some embodiments, the isolation layer comprises silicon oxide, while the sacrificial layer comprises, in part, silicon nitride, and the active layer comprises polysilicon.

At block 404 the memory stack is patterned to form a cell region, including a three-dimensional array of memory cells, arranged in a plurality of n memory cell layers, where a given memory cell layer corresponds to a given unit stack of the plurality of n unit stacks.

At block 406, the memory stack is further patterned to form a staircase region, in an area adjacent to the cell region, wherein the staircase region includes a wordline assembly coupled to the three-dimensional array of memory cells. In some embodiments, the staircase region may comprise multiple staircase regions, arranged on a plurality of sides of the memory array. In some embodiments, the patterning to form the staircase region may be performed in a series of operations, where in at least one operation, the patterning to form the staircase region coincides with the patterning to form the cell region.

The present embodiments provide various advantages over known processing to form devices such as arrays of semiconductor structures for forming DRAM transistors. For one advantage, device structures, such as 3D DRAM arrays, may be formed where a wordline assembly is arranged in an efficient manner in a peripheral staircase region that does not consume excessive area of a given DRAM sub-array. A further advantage afforded by the present embodiments is the increased wordline width in the staircase region, allowing for wider process margin for more facile wordline contact formation. For example, the wordline width may be expanded from a range of 50 nm to 200 nm in a cell region, to a width equivalent to the width of a full memory cell or greater.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A memory device architecture, comprising:
a plurality of memory blocks, arranged in an array, wherein a given memory block comprises:
   a cell region, the cell region comprising a three-dimensional array of memory cells, arranged in a plurality of n memory cell layers; and
   a staircase region, the staircase region being disposed adjacent to at least a first side of the cell region, the staircase region comprising a signal line assembly that is coupled to the three-dimensional array of memory cells, wherein the signal line assembly comprises a wordline assembly, and wherein the staircase region further comprises a plurality of n stairs, wherein a given stair of the plurality of n stairs comprises an uppermost wordline structure of the wordline assembly, and wherein a given memory cell of the plurality of memory cells comprises a memory cell width along a first direction, and wherein in a given stair of the staircase region, the uppermost wordline structure has a wordline width along the first direction that is comparable to the memory cell width.

2. The memory device architecture of claim 1, wherein the staircase region further comprises:
   a wordline contact assembly, wherein a given wordline contact of the wordline contact assembly is connected to the uppermost wordline structure of the given stair.

3. The memory device architecture of claim 1, wherein the uppermost wordline structure is connected to a given row of memory cells of a given memory cell layer of the cell region.

4. The memory device architecture of claim 1, wherein, within a given stair, the uppermost wordline structure comprises:
   a first main portion, disposed over a first part of the given stair;
   a second main portion, disposed over a second part of the given stair; and
   a connecting portion, disposed to electrically connect the first main portion to the second main portion.

5. The memory device architecture of claim 1, wherein a given memory cell layer of the plurality of memory cell layers comprises:
   an isolation layer; a sacrificial layer, disposed subjacent the isolation layer; and
   an active layer, disposed subjacent the sacrificial layer.

6. The memory device architecture of claim 5, wherein the signal line assembly extends from the staircase region into the cell region within the sacrificial layer.

7. The memory device architecture of claim 5, wherein: the isolation layer comprises silicon oxide; the sacrificial layer comprises, in part, silicon nitride; and the active layer comprises polysilicon.

8. The memory device architecture of claim 1, wherein the staircase region comprises;
   a first staircase region, disposed adjacent to the first side of the cell region; and
   a second staircase region, disposed adjacent to a second side of the cell region, opposite to the first side of the cell region.

9. A three-dimensional dynamic random access memory, comprising:
   a plurality of memory blocks, arranged in an array, wherein a given memory block comprises:
      a cell region, the cell region comprising a three-dimensional array of memory cells, arranged in a plurality of n memory cell layers, the cell region further comprising a first plurality of bitlines, extending along a first direction, and a second plurality of wordlines, arranged within the plurality of n memory cell layers, and extending along a second direction, different from the first direction, and
      a staircase region, the staircase region being disposed adjacent to at least a first side of the cell region, the staircase region comprising a wordline assembly that is connected to the second plurality of wordlines of the three-dimensional array of memory cells and a plurality of n stairs, wherein a given stair of the plurality of n stairs comprises an uppermost wordline structure of the wordline assembly, and wherein a given memory cell of the plurality of memory cells comprises a memory cell width along a first direction, and wherein in a given stair of the staircase region, the uppermost wordline structure has a wordline width along the first direction that is comparable to the memory cell width.

10. The three-dimensional dynamic random access memory of claim 9, wherein the staircase region further comprises:
   a wordline contact assembly, wherein a given wordline contact of the wordline contact assembly is connected to the uppermost wordline structure of the given stair.

11. The three-dimensional dynamic random access memory of claim 9, wherein the uppermost wordline structure is connected to a given row of memory cells of a given memory cell layer of the plurality of n memory cell layers.

* * * * *